United States Patent [19]

Sagisaka et al.

[11] Patent Number: 4,949,225
[45] Date of Patent: Aug. 14, 1990

[54] CIRCUIT BOARD FOR MOUNTING ELECTRONIC COMPONENTS

[75] Inventors: Katsumi Sagisaka; Sadahisa Furuhashi, both of Oogaki City, Japan

[73] Assignee: Ibiden Co., Ltd., Japan

[21] Appl. No.: 237,385

[22] Filed: Aug. 29, 1988

[30] Foreign Application Priority Data

Nov. 10, 1987 [JP] Japan .................. 62-284849

[51] Int. Cl.$^5$ .............................................. H05K 1/04
[52] U.S. Cl. ................................. 361/414; 361/386; 361/410
[58] Field of Search ............... 174/52.4; 361/414, 396, 361/410, 386, 388, 421, 383

[56] References Cited

U.S. PATENT DOCUMENTS

| | | | |
|---|---|---|---|
| 3,405,227 | 10/1968 | Hazlett | 361/414 X |
| 3,409,732 | 11/1968 | Dahlgren et al. | 361/414 X |
| 3,777,221 | 12/1973 | Tatusko et al. | 174/52.4 X |
| 4,546,408 | 10/1985 | Rodset et al. | 174/16.3 X |
| 4,659,931 | 4/1987 | Schmitz et al. | 361/414 X |
| 4,680,617 | 7/1987 | Ross | 174/52.5 |
| 4,730,238 | 3/1988 | Cook | 361/414 |

FOREIGN PATENT DOCUMENTS 52-48972 5/1977 Japan .
60-41249 3/1985 Japan .
60-194553 10/1985 Japan .

Primary Examiner—Gerald P. Tolin
Attorney, Agent, or Firm—Leydig, Voit & Mayer

[57] ABSTRACT

In a circuit board wherein a plurality of leads 21 electrically independent of one another protrude from a base member 10, and the respective leads 21 are electrically connected with connection portions 31 of an electronic component 30 mounted on the base member 10; an electronic component mounting circuit board 100 characterized in that internal connection portions 22 are unitarily formed on inner sides of metal members 20 constructing said respective leads 21, that the base members 10 are integrally disposed on both surfaces of said internal connection portions 22, that the electronic components 30 are mounted on said base members 10, and that said electronic components 30 and said internal connection portions 22 are electrically connected. Thus, according to the present invention, it is possible to provide a simply constructed electronic component mounting circuit board which facilitates the design of circuits, which dispenses with the resin molding of the connected portions between the electronic components and the respective leads and affords excellent connection reliability, which can readily form a heat radiating structure, and in which the thermal matching with the electronic components is excellent.

2 Claims, 4 Drawing Sheets

CIRCUIT BOARD FOR MOUNTING ELECTRONIC COMPONENTS

BACKGROUND OF THE INVENTION

1. Field of the Invention

The present invention relates to a circuit board for mounting electronic components, and more particularly to a circuit board wherein the connection portions of an electronic component mounted on a base member and the corresponding leads protruding from the base member are electrically connected.

2. Description of the Prior Art

Electronic components which have been highly densified in recent years cannot alone construct many of the various electronic a available today. Therefore, they are typically packaged on a circuit board. To this end, electronic component mounting circuit boards in various forms have heretofore been developed and proposed.

There are, for example, three types of connections for connecting electronic components and terminals to external connections, such as leads, in a circuit board. The first type is, the so-called PGA type wherein a large number of conductor pins planted in a predetermined array are connected with the electronic components through conductor circuits formed on the circuit board. The second type is the so-called TAB type wherein parts of the conductor circuits on the circuit board are used as finger leads for directly mounting the electronic components thereon. The third type is the so-called DIP type wherein the leads and the electronic components are connected by wire bonding and then the whole assembly is molded.

Various concrete devices exemplifying a circuit board of the DIP type, in which a plurality of leads electrically independent of one another are protruded from a base member and in which the respective leads and the connection portions of the electronic components mounted on the base member are electrically connected, have been proposed in the Japanese patent application Laid-Open No. 60-194553, etc. Proposed in this laid open application is:

"A hybrid integrated circuit device characterized in that a circuit base plate which is made of a material selected from the group consisting of silicon, polyimide resin, alumina, epoxy resin, and glass epoxy resin is bonded with adhesives to an island portion of a metallic base ribbon, and in that a circuit element is mounted on said circuit base plate and is molded with a resin." The basic construction of prior-art circuit boards for mounting electronic components as represented by the circuit board of such a hybrid integrated circuit device can be chiefly classified into two types as illustrated in FIGS. 1 and 2. The first basic construction includes a metal member (the metallic base ribbon) located at a portion (the island portion) on which the electronic component is mounted and being quite independent from a plurality of other portions that are destined to become leads. The second basic construction is related to the first basic construction and is a construction wherein the metal member located at a portion for mounting the electronic component thereon and the plurality of other portions destined to become leads are all independent of each other and must there be connected by wire bonding.

Prior-art circuit boards of the type in which the connection portions of the electronic component mounted on the base member are electrically connected with the respective leads must, employ one of the basic constructions as stated above because the individual leads need to be electrically independent. Therefore the corresponding terminals of the electronic component must be respectively connected to these leads separately and independently. Also for reasons concerning actual manufacture, the aforementioned two basic constructions seem to be adopted. More specifically, the electronic component mounting circuit board as stated above is entirely molded with a resin by so-called transfer molding after the predetermined wire bonding has been performed, in which case the positioning of the respective leads needs to be easy. To this end, as illustrated in FIG. 2, the leads 21 and the metal member located at the portion (island portion 26) for mounting the electronic component thereon are formed as a single metal plate by the use of a frame or the like beforehand, thereby making it possible for the leads and the metal member located at the island portion to be arranged in the same plane.

With the aforementioned basic construction, however, the following problems which must be solved arise in implementing high-density packaging which is particularly required of a variety of electronic component mounting circuit boards in recent years:

(1) The leads and those conductor circuits on the base plate to which the electronic component is connected must be directly connected by the wire bonding. Therefore, electrodes need to be led out to circuit end portions (the outer peripheral parts of the island portion), not only because the entirety after the mounting of the electronic component is molded with the resin, but also because the wire bonding is carried out with short distances. Accordingly, versatility in the design of a circuit becomes very low.

It is also an indispensable condition that the leads be subjected to gold or silver plating for reliably performing the wire bonding.

(2) Other than being used as the base of the electronic component, the metal member located at the island portion, namely, the metallic base ribbon located at the island portion, is used merely for forming or reinforcing the electronic component mounting portion, and it cannot be positively utilized as a wiring circuit. Accordingly, the metallic base ribbon located at the island portion is unsuitable for high-density packaging.

(3) In general, an electronic component generates heat when energized, and this heat must be dissipated to the exterior. Nevertheless, in the electronic component mounting circuit board of the prior art described before, the metal member located underneath the electronic component is not joined with other metal portions but is embedded in the base member. Therefore, even though the metal member is in the circuit board and is an excellent thermal conductor, it cannot be positively utilized as a heat radiating member.

(4) Since the island portion for mounting the electronic component thereon and the lead portions to be connected to the exterior are respectively independent and separate, both can be connected only by wire bonding. Therefore, high-density packaging is difficult, and it is also required that bonding wire pieces are molded with the resin so as to enhance reliability.

(5) Even if the electronic component and the circuit board side are connected by solder in some places, the connections of the former to the leads must fundamentally be done by wire bonding. Therefore, a so-called molded electronic component for general purposes is difficult to use.

SUMMARY OF THE INVENTION

As a result of earnest research by the inventors in order to solve the problems described above, it has been discovered that good results are produced when internal connection portions are unitarily formed inside the leads and are embedded in a base member constituting a circuit board, completing the present invention.

Therefore, an object of the present invention is to provide a simply constructed electronic component mounting circuit board which facilitates circuit design, dispenses with the resin molding of the connected parts between electronic components and respective leads and affords excellent connection reliability, can readily form a heat radiating structure, and has excellent thermal matching with the electronic, components.

Accordingly, the present invention provides a circuit board for mounting at least one electronic component wherein the circuit board comprises a substrate and several metal members. The substrate includes at least one inner base member and an outer base member on which the electronic component is mounted. Both the inner base member and the outer base member have through holes. The metal members are electrically independent of one another and protrude from the substrate. Each metal member includes a lead and an internal connection portion unitarily formed with the lead. The internal connection portion, which has a larger area than the lead, has first and second services and the substrate contacts both surfaces of the internal connection portion. The circuit board further comprises conductor circuits between the base members. The conductor circuits extend through the internal connection portions and through the through holes onto the outer base member to electronically connect the metal members to the electronic component.

Various means employed by the present invention will be detailedly in detail according to the embodiments thereof illustrated in the drawings.

DESCRIPTION OF THE PREFERRED EMBODIMENTS

Figure 1:
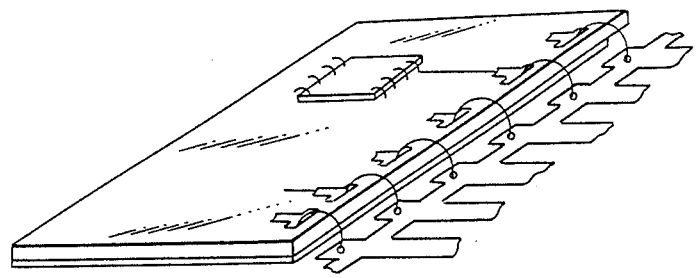
FIG. 1 is a schematic perspective view showing a prior electronic component mounting circuit board.
Figure 2:
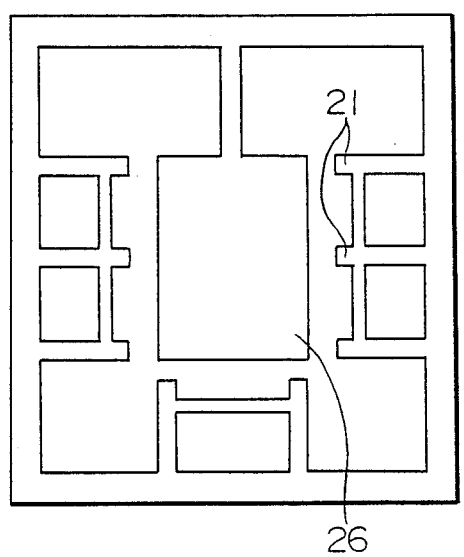
FIG. 2 is a plan view of a metallic base ribbon which is used in a prior, electronic component mounting circuit board.
Figure 3:
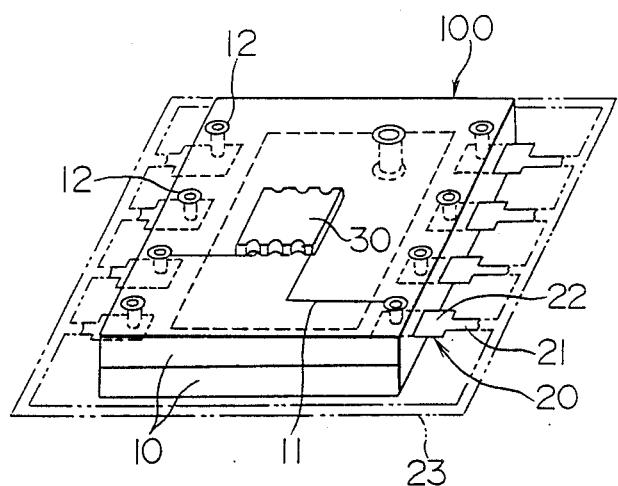
FIG. 3 is a perspective view of an electronic component mounting circuit board which is the first embodiment of the present invention.
Figure 11:
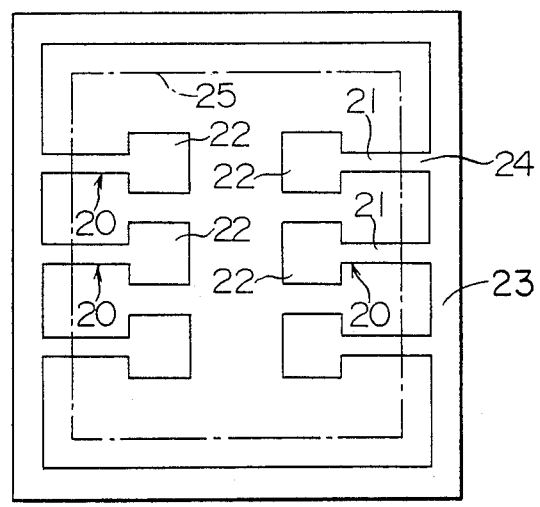
FIG. 11 is a plan view of a metallic base ribbon in which a plurality of metal members are joined by a frame.

In the electronic component mounting circuit board 100 as shown in FIG. 3 each electronic component 30 to be mounted thereon is packaged to another large scale substrate by means of each lead 21 outwardly extruding from the substrate 10. Each lead 21 employed here is provided into one body with an internal connection portion 22 embedded into the substrate 10. That is, each metal member 20 is constructed of a lead 21 and an internal connection portion 22, and such metal members 20 are jointed to a frame 23 as shown in FIG. 11. The substrate 10 is made of suitable material such as resin, ceramics and the like, Both surfaces of the internal connection portion 22 of each metal member 20 extend inside the substrate 10, and conductor circuits 11 for electronic components 30 are formed onto at least this substrate 10. Each conductor circuit 11 or the connection portions of the electronic components 30 are electrically connected with each internal connection portion 22 or the leads 21 by means of through holes 12 or bonding wire pieces 32.

Figure 4:
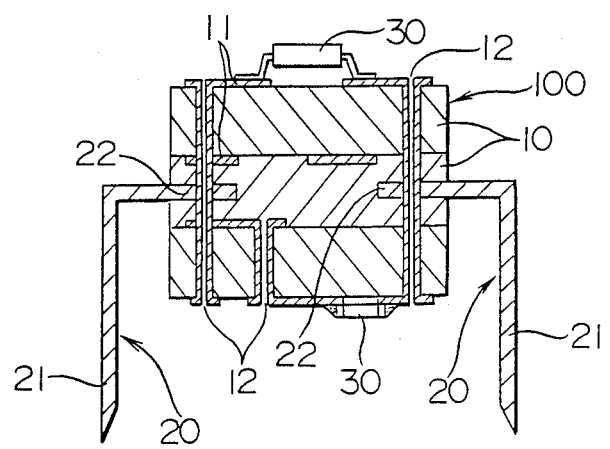
FIG. 4 is a sectional view of the circuit board of the first embodiment.
Figure 6:
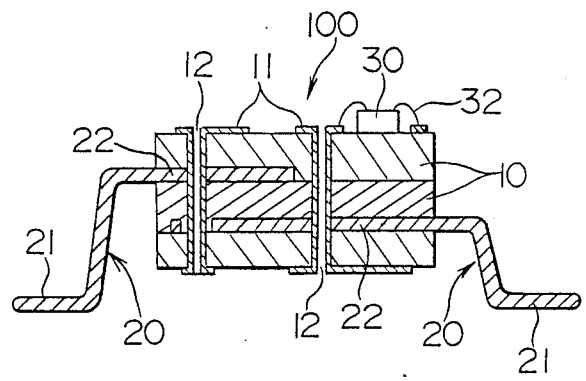
FIG. 6 is a sectional view of the circuit board of the second embodiment.
Figure 8:
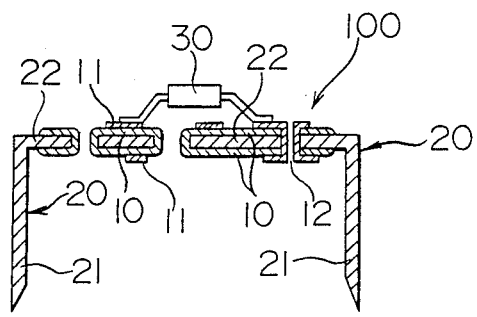
FIG. 8 is a sectional view of an electronic component mounting circuit board which is the fourth embodiment of the present invention.

As described above, various materials may be employed for the substrate 10, including not only various resins such as silicon, polyimide, epoxy, glassepoxy and the like, but also ceramics such as alumina and the like, provided that they are of insulation and can be securely adhered onto the internal connection portion 22 made of metal. Further, one body laminated substrate of plural material layers may be employed as the substrate 10. As shown in FIG. 8, it may be formed onto the metal member 20 by printing method and the like. So, each substrate 10 not only can be formed onto both surfaces of the internal connection portion 22 of the metal member 20 and but also, as shown in FIGS. 4, 6, it may be constructed as a multilayer substrate. Of course, when a multilayer substrate is employed as the substrate 10, conductor circuits 11 may be formed between respective layers.

Figure 7:
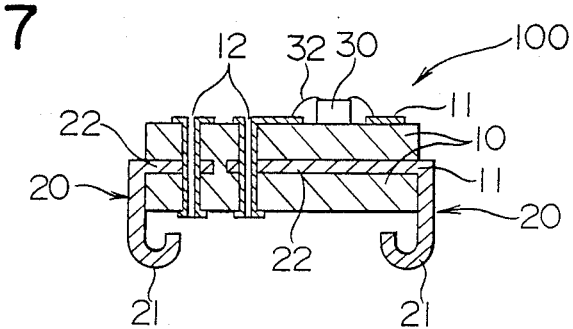
FIG. 7 is a sectional view of an electronic component mounting circuit board which is the third embodiment of the invention.

Various materials may also be applied for constructing the metal members 20. Any metal having the necessary electric conductivity may be satisfactorily employed. for example, copper, iron, a so-called 42 Alloy and the like may be appropriately employed. Because the lead 21 portion of the metal member 20 may be used in the folded condition as shown in FIG. 6 or FIG. 7 or may be used as a radiating fin, it is desirable to choose the appropriate material. In this connection, the metal member 20 mainly made of copper is the most suitable one.

In this electronic component mounting circuit board 100, respective electronic components 30 mounted thereon are connected to the respective leads 21 via through holes 12 or bonding wire pieces 32 as described above. Accordingly, because the type of electronic components 30 employed for this electronic component mounting circuit board 100 is never limited, either the DIP type of connection or a molded surface packaging component such as a chip-on-board may be preferably employed. Further, the electronic components 30 may be mounted on both surfaces of this electronic component mounting circuit board 100.

Now, the present invention will be described in detail in conjunction with the embodiments illustrated in the drawings.

Embodiment 1

Shown in FIGS. 3 and 4 is the first embodiment of the present invention. In this embodiment, base members 10 are constructed in a multilayer structure. Conductor circuits 11 are formed, not only on the surfaces of the base members 10, but also between the adjacent base members 10. The internal connection portions 22 of metal members 20 are embedded in the base member 10 positioned as the middle layer of the multilayer structure shown in FIG. 4. The leads 21 are unitary with the respective internal connection portions 22 and protrude outside the base member 10. In addition, the respective leads 21 are bent at right angles to the corresponding internal connection portions 22 in order that the electronic component mounting circuit board 100 of the embodiment may be made as a so-called DIP type wherein it is attached to another large-sized circuit board, or the like.

Further, in the electronic component mounting circuit board 100, an electronic component 30 of the DIP type is soldered to the conductor circuits 11 on the upper surface as viewed in FIG. 4, while an electronic component 30 of the surface-packaging type is soldered to the conductor circuits 11 on the lower surface.

In an example of the electronic component mounting circuit board 100 of the first embodiment, the base members 10 were formed of a glass epoxy resin, and the metal members 20 were formed of a copper-based material.

Embodiment 2

Figure 5:
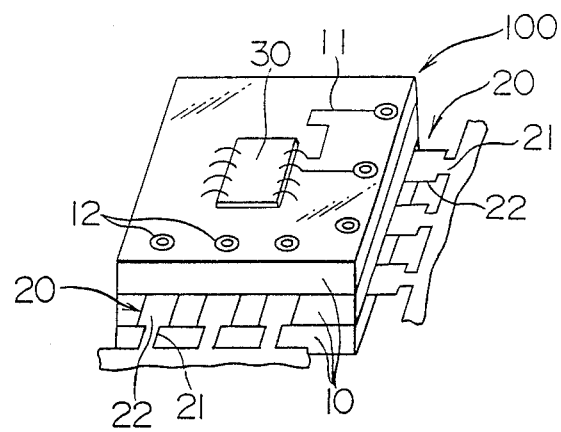
FIG. 5 is a perspective view of an electronic component mounting circuit board which is the second embodiment of the present invention.

Shown in FIGS. 5 and 6 is the second embodiment of the present invention. In this embodiment, as in the first embodiment, base members 10 are constructed into a multilayer structure, and conductor circuits 11 are formed on the surfaces of these base members 10. Also, the internal connection portions 22 of metal members 20 are embedded between adjacent base members 10, and leads 21 unitary with the respective internal connection portions 22 protrude outside the base members 10.

In the second embodiment, the internal connection portion 22 of the metal member 20 is formed so as to have a somewhat larger area than in the case of the first embodiment. Thus, each internal connection portion 22 is intended to function also as a conductor circuit which is located between the adjacent base members 10. For that purpose, the internal connection portion 22 is positively formed with a portion (which may well be a mere opening) where it is not in direct contact with a through hole 12.

Also, in the electronic component mounting circuit board 100 of this embodiment, the internal connection portions 22 of the metal members 20 are arranged so as to lie over and under each other within the multilayer structure of the base members 10. More specifically, the electronic component mounting circuit board 100 is formed using a plurality of sheets (two sheets in this embodiment) in each of which a plurality of metal members 20 are made integral as illustrated in FIG. 11. The trains of the leads 21 projecting at the end faces of the base members 10 have their levels shifted as shown in FIG. 5.

FIG. 11 is a plan view of a metallic base ribbon in which a plurality of metal members 20 are joined by a frame 23. As seen from the figure, each metal member 20 is constructed of a lead 21 and an internal connection portion 22, and such metal members 20 are joined to the frame 23 through joint portions 24. In the figure, numeral 25 indicates a cutting line along which the metallic base ribbon is finally cut.

Further, in the electronic component mounting circuit board 100 of the second embodiment, the outer parts of the metal members 20 unitary with the internal connection portions 22 are bent as shown in FIG. 6, whereby this circuit board is suited to surface packaging.

In an example of the electronic component mounting circuit board 100 of the second embodiment, the base members 10 were formed of a resinous material of a high glass transition point. Thus, an electronic component 30 can be connected by pieces of bonding wire 32 to the conductor circuits 11 located on the surface of the base member 10. That is, in the electronic component mounting circuit board 100, the electronic component 30 is connected to the conductor circuits 11 on the base member 10 by wire bonding. In the example, the metal members 20 were formed of a copper-based material. Further, since the bonding wire pieces 32 are used in this embodiment, at least these bonding wire 32 portions need to be molded with a resin or the like.

Embodiment 3

FIG. 7 shows a sectional view of an electronic component mounting circuit board 100 according to the third embodiment of the present invention. The third embodiment is fundamentally the same as the second embodiment. However, a polyimide film with adhesives is adopted as each base member 10, and the internal connection portions 22 of metal members 20 are sandwiched between the two base members 10 and are thus bonded and fixed. Also, in order to facilitate the surface packaging of the electronic component mounting circuit board 100, the fore ends of respective leads 21 are bent inwards as illustrated in FIG. 7. In this example, a "42 Alloy" was employed for the metal members 20 in this embodiment.

Embodiment 4

FIG. 8 shows a sectional view of an electronic component mounting circuit board 100 according to the fourth embodiment of the present invention. In this fourth embodiment, the internal, connection portions 22 of metal members 20 made of the "42 Alloy" are formed with base members 10 by printing or dipping. That is, the base members 10 in this embodiment are formed to be very thin.

Embodiment 5

Figure 9:
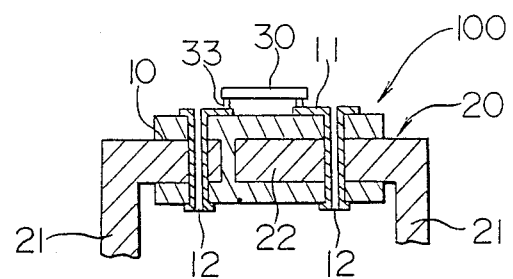
FIG. 9 is a sectional view of an electronic component mounting circuit board which is the fifth embodiment of the present invention.

FIG. 9 shows a sectional view of an electronic component mounting circuit board 100 according to the fifth embodiment of the present invention. In this circuit board 100, the base member 10 is thin relative to the internal connection portion 22 of each metal member 20 in particular. The material of the metal members 20 is selected in conformity with the type of electronic component 30 to be mounted on the circuit board 100.

More specifically, if the electronic component 30 is a leadless chip carrier such as an alumina package, "42 Alloy" is selected as the material of the metal members 20, whereby the coefficients of thermal expansion of the metal members 20 and the electronic component 30 are substantially equalized, so as to permit the mounting of the electronic component 30 of this sort and to realize connections of high reliability. Likewise, if the electronic component 30 is a so-called silicon chip, the metal members 20 are formed of a copper-clad iron-nickel alloy, whereby the coefficients of thermal expansion of the metal members 20 and the electronic component 30 are substantially equalized, so as to permit the mounting of the electronic component 30 of this sort and to realize connections of high reliability.

Embodiment 6

Figure 10:
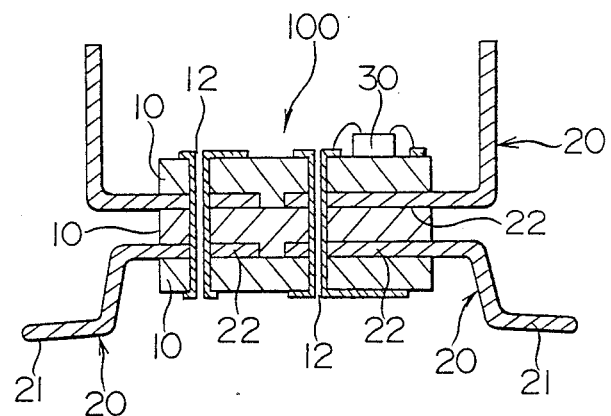
FIG. 10 is a sectional view of an electronic component mounting board which is the sixth embodiment of the present invention.

FIG. 10 shows a sectional view of an electronic component mounting circuit board 100 according to the sixth embodiment of the present invention. This sixth embodiment is very similar to the second embodiment, but the former differs from, the latter in that the lead portions of the metal members 20 located above in FIG. 10 are bent upwards whereas to the leads 21 of metal members 20 located below. The upwardly-bent portions of the metal members 20 are not used as external connection terminals but are used as heat radiating portions. Thus, with this circuit board 100, heat radiation characteristics are excellent.

To sum up, in accordance with the present invention it possible to provide a simply constructed electronic component mounting circuit board 100 which facilitates the design of a circuit, which dispenses with the resin molding of the connected portions between the electronic components and the respective leads and affords excellent connection reliability, which can readily form a heat radiating structure, and in which the thermal matching with the electronic components is excellent.

More specifically, the electronic component mounting circuit board 100 has the concrete effects stated below:

(1) Since the respective leads are connected by through holes 12 with conductor circuits 11 located on the base members 10 or conductor circuits 11 located in the base members 10, the leads and the conductor circuits 11 on the base members 10 to which the electronic components 10 are connected need not be connected directly by wire bonding. Accordingly, it is unnecessary that the conductor circuits 11 be led out to circuit end portions (an island portion) so that the wire bonding can be realized with short distance. Therefore the circuits can be freely designed.

Moreover, since the leads 21 and the conductor circuits 11 on the base member 10 to which the electronic component 30 is connected need not be connected directly by wire bonding, the electronic component mounting circuit board 100 need not always be subject to plating the leads 21. Therefore the circuits can be fabricated easily and inexpensively.

(2) In the electronic component mounting circuit board 100, the metal members 20 need not be formed at the portion (island portion) where the electronic component 30 is mounted. The reasons are that the portion to be used as the base of the electronic component 30 can be substituted by another conductor circuit 11, and that strength can be readily ensured by the internal connection portion 22 of each metal member 20 and the base member 10 itself.

(3) Heat from the electronic component 30 can be dissipated to the exterior with ease. The internal connection portions 22 of the metal members 20 are embedded in the base members 10, and the leads 21 which are unitary therewith protrude outside the base members 10. Therefore, the metal members 20 which have excellent thermal conductivity can be positively utilized as heat radiating members.

(4) Since the respective conductor circuits 11 and leads 21 can be connected through corresponding through holes 12, the electrical reliability of the connections can be rendered very high. Moreover, it is possible to form a large number of through holes 12. Therefore, each electronic component 30 can satisfactorily endure even comparatively large currents flowing therethrough, and the range of applications of the circuit board of the invention can be widened much more than that of the prior-art circuit board wherein the conductor circuits and the leads are connected only by wire bonding which uses fine metallic wire.

(5) Owing to a structure in which the respective conductor circuits 11 and leads 21 are connected through corresponding through holes 12, the base members 10 as well as the conductor circuits 11 can be satisfactorily brought into a multilayer assembly, and the structure of the portion where the electronic component 30 is mounted can be altered at will. In the electronic component mounting circuit board 100, therefore, the type of electronic component 30 to be mounted does not come into question at all, and packaging at a sufficient high density can be implemented.

What is claimed is:

1. A circuit board for mounting at least one electronic component, the circuit board comprising:
    a substrate including at least one inner base member and an outer base member on which the at least one electronic component is mounted said base member having through holes;
    a plurality of metal members which are electrically independent of one another and which protrude from the substrate, each metal member including a lead and an internal connection portion unitarily formed with the lead and having a larger area than the lead and first and second surfaces, the substrate contacting both surfaces of the internal connection portion; and
    conductor circuits between said base members extending through the internal connection portions and through the through holes onto the outer base member to electrically connect the metal members to the at least one electronic component.

2. A circuit board for mounting at least one electronic component as defined in claim 1 wherein said internal connection portions of said respective leads are arranged in a state in which they lie over and under each other.

* * * * *